United States Patent
Song et al.

(10) Patent No.: US 10,535,832 B2
(45) Date of Patent: Jan. 14, 2020

(54) LIGHTING APPARATUS USING ORGANIC LIGHT EMITTING DIODE AND MANUFACTURING METHOD THEREOF

(71) Applicant: LG Display Co., Ltd., Seoul (KR)

(72) Inventors: TaeJoon Song, Paju-si (KR); JongMin Kim, Pyeongtaek-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/032,155

(22) Filed: Jul. 11, 2018

(65) Prior Publication Data
US 2019/0019980 A1 Jan. 17, 2019

(30) Foreign Application Priority Data
Jul. 11, 2017 (KR) .................. 10-2017-0088075

(51) Int. Cl.
| | |
|---|---|
| *H01L 29/08* | (2006.01) |
| *H01L 51/52* | (2006.01) |
| *H01L 27/32* | (2006.01) |
| *H01L 51/56* | (2006.01) |

(52) U.S. Cl.
CPC ...... *H01L 51/5212* (2013.01); *H01L 27/3202* (2013.01); *H01L 51/524* (2013.01); *H01L 51/56* (2013.01); *H01L 2251/5361* (2013.01); *H01L 2251/5392* (2013.01); *H01L 2251/558* (2013.01)

(58) Field of Classification Search
CPC . H01L 51/52; H01L 51/5253; H01L 51/5212; H01L 51/524
See application file for complete search history.

(56) References Cited

U.S. PATENT DOCUMENTS

| | | | |
|---|---|---|---|
| 2002/0196402 A1* | 12/2002 | Sanford | G02F 1/1345 349/158 |
| 2006/0012741 A1* | 1/2006 | Mizusako | G02F 1/133707 349/130 |
| 2008/0106207 A1 | 5/2008 | Yoon et al. | |
| 2009/0026469 A1 | 1/2009 | Yamamoto | |
| 2009/0135146 A1* | 5/2009 | Scholz | G06F 3/044 345/173 |

(Continued)

OTHER PUBLICATIONS

European Search Report dated Oct. 12, 2018 issued in the corresponding European Patent Application No. 18182768.4, pp. 1-8.

*Primary Examiner* — Phuc T Dang
(74) *Attorney, Agent, or Firm* — Polsinelli PC

(57) ABSTRACT

A lighting apparatus of the present disclosure includes an organic light emitting diode formed by a first electrode, an organic light emitting layer, and a second electrode on a first substrate and configures the first electrode by a transparent conductive material having an electrical resistance of 2800 to 5500Ω in each pixel. Therefore, even though the first electrode and the second electrode are in contact with each other to remove the electrical resistance by the organic light emitting layer in the pixel, the overcurrent is suppressed from being applied to the pixel by the electrical resistance of the first electrode. Further, at least one conductive pattern formed of a low electrical resistance transparent conductive material which is connected to the first electrode in the pixel is disposed to suppress the degradation of the luminance by the first electrode having a high electrical resistance.

28 Claims, 13 Drawing Sheets

(56) References Cited

U.S. PATENT DOCUMENTS

| | | | |
|---|---|---|---|
| 2010/0309101 A1 | 12/2010 | Kanegae et al. | |
| 2011/0193066 A1* | 8/2011 | Parker | H01L 27/3276 257/40 |
| 2013/0154478 A1 | 6/2013 | Ohe et al. | |
| 2014/0175972 A1 | 6/2014 | Lee et al. | |
| 2014/0356993 A1* | 12/2014 | Wei | H01L 33/007 438/28 |
| 2016/0043161 A1* | 2/2016 | Miyazawa | H01L 27/3246 257/40 |
| 2017/0005150 A1 | 1/2017 | Yeo et al. | |
| 2017/0084863 A1* | 3/2017 | Kang | H01L 51/5228 |
| 2017/0125496 A1* | 5/2017 | Oh | H01L 51/5265 |
| 2017/0125505 A1* | 5/2017 | Oh | H01L 51/52 |
| 2017/0271370 A1* | 9/2017 | Wang | G02F 1/133345 |
| 2017/0331067 A1* | 11/2017 | Park | C09K 11/06 |
| 2017/0358637 A1* | 12/2017 | Lee | H01L 27/3251 |
| 2018/0019263 A1* | 1/2018 | Kong | H01L 27/12 |

\* cited by examiner

LIGHTING APPARATUS USING ORGANIC LIGHT EMITTING DIODE AND MANUFACTURING METHOD THEREOF

CROSS-REFERENCE TO RELATED APPLICATION

This application claims the priority of Korean Patent Application No. 10-2017-0088075 filed on Jul. 11, 2017, in the Korean Intellectual Property Office, the disclosure of which is incorporated herein by reference in its entirety.

BACKGROUND

Field of the Disclosure

The present disclosure relates to a lighting apparatus, and more particularly to, a light apparatus using an organic light emitting diode and a manufacturing method thereof. Although the present disclosure is suitable for a wide scope of applications, it is particularly suitable for preventing a failure due to a short-circuit between an anode and a cathode of the organic light emitting diode.

Description of the Background

Currently, fluorescent lamps or incandescent lamps are mainly used as lighting apparatuses. Among them, the incandescent lamps have a good color rendering index (CRI), but have a very low energy efficiency. Further, the fluorescent lamps have a good efficiency, but have a low color rendering index and contain mercury, which may cause an environmental problem.

In order to solve the problems of the lighting apparatus of the related art, recently, a light emitting diode (LED) is suggested as a lighting apparatus. The light emitting diode is formed of an inorganic light emitting material. A luminous efficiency is the highest in the blue wavelength range and the luminous efficiency is degraded toward a red wavelength range and a green wavelength range which has the highest visibility. Therefore, there is a problem in that when a red light emitting diode, a green light emitting diode, and a blue light emitting diode are combined to emit white light, the luminous efficiency is degraded. Further, there is an additional problem in that when the red light emitting diode, the green light emitting diode, and the blue light emitting diode are used, since widths of emission peaks are narrow, the color rendering property is also deteriorated.

In order to solve the above-described problems, there has been proposed a lighting apparatus which outputs white light by combining a blue light emitting diode and a yellow fluorescent material to output white light, instead of a combination of the red light emitting diode, the green light emitting diode, and the blue light emitting diode. The reason why the light emitting diode configured as described above is proposed is that it is more effective to use only a blue light emitting diode having a high efficiency and a fluorescent material which receives blue light to emit yellow light for the remaining colors than to use a green light emitting diode having a low luminous efficiency.

However, in the case of the lighting apparatus which combines the blue light emitting diode and a yellow fluorescent material to output white light, since the fluorescent material which emits yellow light has a low luminous efficiency, there is a limitation in improvement of the luminous efficiency of the lighting apparatus.

In order to solve the problem in that the luminous efficiency is degraded, a lighting apparatus using an organic light emitting diode formed of an organic light emitting material has been proposed. Normally, the organic light emitting diode has relatively excellent luminous efficiencies of red and green light as compared with an inorganic light emitting diode. Further, widths of emission peaks of blue, red, and green light of the organic light emitting diode are relatively broader than that of the inorganic light emitting diode so that a color rendering property is improved. Therefore, there is an advantage in that light of the light emitting device is more similar to the sunlight.

The organic light emitting diode comprises of an anode, a cathode, and an organic light emitting layer therebetween. However, in the organic light emitting diode used for the lighting apparatus, a distance between the anode and the cathode is small so that the anode and the cathode can be brought in direct contact with each other due to pinholes or cracks caused by permeation of foreign materials, a step of an internal structure of the organic light emitting diode, and roughness of laminated layers, so that a short-circuit can cause between the anode and the cathode. Further, due to a process failure or a process error when the organic light emitting layer is formed, the organic light emitting layer is formed to be thinner than a desired thickness so that there may be a problem in that the anode and the cathode are electrically short-circuited.

When the anode and the cathode are electrically short-circuited, the short-circuit area forms a low electrical resistance path through which a current flows so that the current flows only in the short-circuit area, but current which flows through the other area of the organic light emitting diode is considerably reduced or in extreme cases, the current does not flow. Therefore, the emission output of the organic light emitting diode is reduced or the organic light emitting diode does not emit light.

When such an organic light emitting diode is applied to the lighting apparatus, light having luminance which is lower than a desired luminance is emitted due to the short-circuit of the anode and the cathode so that a quality of the lighting apparatus is degraded or even the lighting apparatus does not operate. Further, when the organic light emitting diode is applied to the display device, pixels corresponding to the short-circuited area become defective pixels so that the quality of the display device is degraded.

Generally, since organic light emitting diodes are manufactured in a clean room, the short-circuit of the anode and the cathode caused by foreign materials such as dusts permeating during a manufacturing process may be avoided. Nonetheless, even in the clean room, the permeation of the foreign materials cannot be completely avoided and the short-circuit due to a structural problem such as a step of an internal structure of the organic light emitting diode and the roughness of the laminated layers cannot be avoided. Therefore, the failure due to the short-circuit cannot be entirely avoided.

SUMMARY

Accordingly, the present disclosure is to provide a lighting apparatus in which a first electrode of an organic light emitting diode is formed by a transparent conductive material having a high electrical resistance which is equal to or higher than a set value to suppress the short-circuit due to contact of the first electrode and the second electrode.

In addition, the present disclosure is to provide a lighting apparatus in which at least one conductive pattern having a low electrical resistance which is in contact with the first electrode in a plurality of pixels is formed to suppress degradation of luminance by the first electrode having a high electrical resistance.

According to an aspect of the present disclosure, a lighting apparatus comprises a first substrate including a plurality of pixels, and an organic light emitting diode disposed in each of the plurality of pixels of the first substrate and comprisinga first electrode, an organic light emitting layer, and a second electrode, in which the first electrode is made of a transparent conductive material whose electrical resistance is at least half of that of the organic light emitting layer in each pixel. Therefore, even though the first electrode and the second electrode are in contact with each other to remove an electrical resistance by the organic light emitting layer in the pixel, an overcurrent is suppressed from being applied to the pixel due to the electrical resistance of the first electrode.

According to another aspect of the present disclosure, a light emitting device comprises a first substrate, an auxiliary electrode on the first substrate, the auxiliary electrode being disposed in a matrix to divide the first substrate into a plurality of pixels, a first electrode on the first substrate, the first electrode being electrically connected to the auxiliary electrode, an organic light emitting layer on the first electrode; and a second electrode on the organic light emitting layer, wherein the first electrode is made of a transparent conductive material whose electrical resistance is at least half of that of the organic light emitting layer.

According to a further aspect of the present disclosure, a method of manufacturing a light emitting device comprises forming an auxiliary electrode on a first substrate to be disposed in a matrix form, forming a first electrode on the first substrate to be electrically connected with the auxiliary electrode, forming an organic light emitting layer to be disposed on the first electrode, and forming a second electrode to be disposed on the organic light emitting layer, wherein the first electrode is formed of a transparent conductive material having an electrical resistance of at least half of the organic light emitting layer.

According to the present disclosure, a first electrode which forms the organic light emitting diode is formed of a transparent conductive material having a high electrical resistance so that even though the first electrode and the second electrode of the organic light emitting diode are in contact with each other, the short-circuit of the organic light emitting diode is suppressed. Therefore, degradation of the luminance of the lighting apparatus or a driving failure of the lighting apparatus due to the overcurrent which is applied through a pixel where the contact is generated may be suppressed.

Specifically, according to the present disclosure, the short-circuit due to the contact of the first electrode and the second electrode is suppressed without forming a separate resistive layer or resistive pattern so that the complexity of the manufacturing process and the lowering of the aperture ratio may be suppressed.

Further, according to the present disclosure, at least one transparent conductive pattern having a low electrical resistance which is electrically connected to the first electrode is formed in each of a plurality of pixels so that a conductivity of the first electrode in the pixel is locally improved so that the degradation of the luminance of the lighting apparatus due to the first electrode having a high electrical resistance may be suppressed.

BRIEF DESCRIPTION OF THE DRAWINGS

The accompanying drawings, which are included to provide a further understanding of the present disclosure and are incorporated in and constitute a part of this application, illustrate aspect(s) of disclosure and together with the description serve to explain the principle of the disclosure.

In the drawings:

FIGS. 8A and 8B are views illustrating that a first electrode and a second electrode are in contact with each other in a predetermined area in a pixel due to pinholes and the like;

DETAILED DESCRIPTION

Reference will now be made in detail to the aspects of the present disclosure, examples of which are illustrated in the accompanying drawings. Whenever possible, the same reference numbers will be used throughout the drawings to refer to the same or like parts.

In the present disclosure, provided is a lighting apparatus including an organic light emitting diode formed of an organic material, rather than a lighting apparatus including an inorganic light emitting diode formed of an inorganic material.

The organic light emitting diode formed of an organic light emitting material has relatively excellent luminous efficiencies of red and green light as compared with an inorganic light emitting diode. Further, widths of emission peaks of blue, red, and green light of the organic light emitting diode are relatively broader than that of the inorganic light emitting diode so that a color rendering property is improved. Therefore, there is an advantage in that light of the light emitting device is more similar to the sunlight.

Specifically, the present disclosure provides a light emitting device including an organic light emitting diode which may suppress the degradation of a luminous efficiency of the light emitting device or non-emission of the lighting apparatus when some of pixels of the organic light emitting diode are short-circuited.

Figure 1:
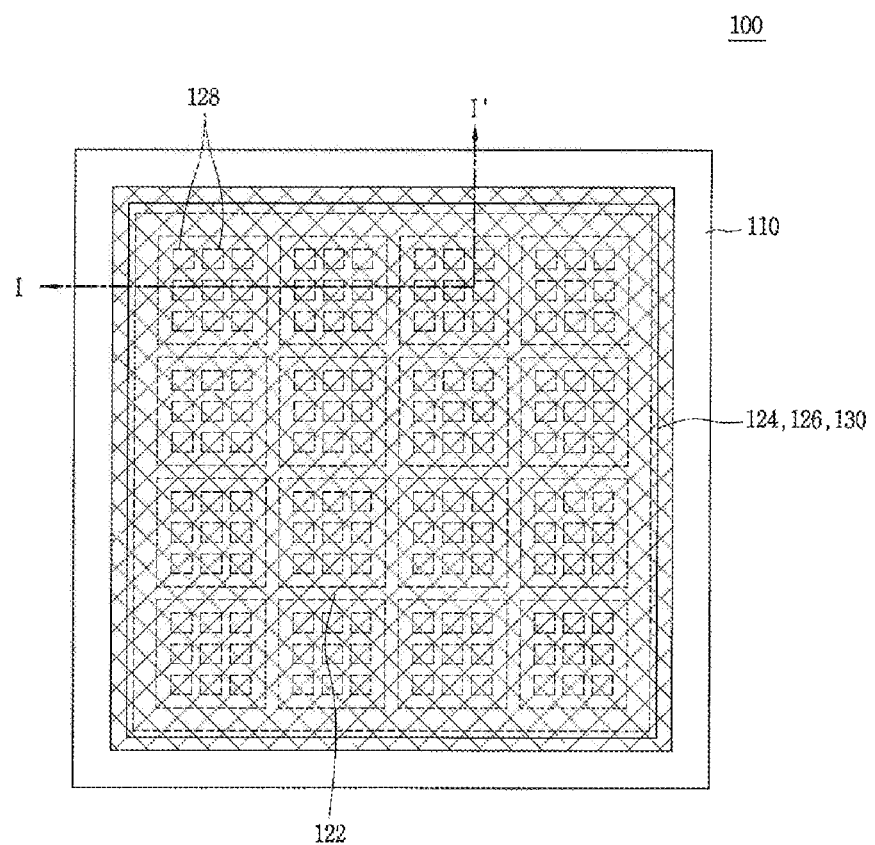
FIG. 1 is a plan view illustrating a structure of a lighting apparatus according to the present disclosure.

FIG. 1 is a plan view illustrating a structure of a lighting apparatus using an organic light emitting diode according to the present disclosure.

As illustrated in FIG. 1, a lighting apparatus 100 according to the present disclosure is a surface emission lighting apparatus and a first electrode 124 and a second electrode 126 are disposed over the entire surface of the first substrate 110 and an organic light emitting layer 130 is disposed between the first electrode 124 and the second electrode 126 to form an organic light emitting diode. In the lighting apparatus 100 having the structure as described above, a signal is applied to the first electrode 124 and the second electrode 126 of the organic light emitting diode to cause the organic light emitting layer 130 to emit light so that light is output from the entire substrate 110.

An auxiliary electrode 122 is disposed on the first substrate 110 in a matrix form. The auxiliary electrode 122 is made of a metal having a high electrical conductivity to apply uniform voltage to the first electrode 124 disposed in the entire area of the first substrate 110 so that a large size lighting apparatus 100 may emit light with uniform luminance.

Further, at least one conductive pattern 128 is disposed above or below the first electrode 124. In this case, the at least one conductive pattern 128 is disposed in a closed curve of the auxiliary electrode 122.

The organic light emitting layer 130 is made of an organic light emitting material which outputs white light. For example, the organic light emitting layer 130 may be formed of a blue organic light emitting layer, a red organic light emitting layer, and a green organic light emitting layer or may be formed of a tandem structure including a blue light emitting layer and a yellow-green light emitting layer. However, the organic light emitting layer 130 of the present disclosure is not limited to the above-described structure and various structures may be applied therefor.

Further, the organic light emitting layer 130 of the present disclosure may further include an electron injection layer and a hole injection layer which inject electrons and holes to the organic light emitting layer, respectively and an electron transport layer and a hole transport layer which transport the injected electrons and holes to the organic light emitting layer, respectively, and a charge generating layer which generates charges such as electrons and holes.

Even though not illustrated in the drawing, a first pad and a second pad which are connected to the first electrode 124 and the second electrode 126, respectively, to be applied with a voltage from the outside are disposed on the first substrate 110. In this case, the first pad and the second pad may be formed at one edge of the first substrate 110 or may be formed at both edges, respectively. Further, a plurality of first pads and second pads may be provided to be disposed at four edges of the first substrate 110.

Figure 2:
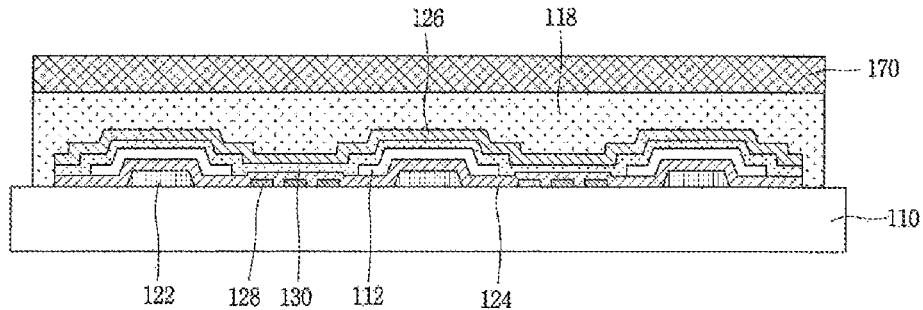
FIG. 2 is a cross-sectional view taken along line I-I' of FIG. 1.

FIG. 2 is a cross-sectional view taken along line I-I' of FIG. 1 and the lighting apparatus 100 according to the present disclosure will be described in more detail with reference to FIG. 2.

As illustrated in FIG. 2, the at least one conductive pattern 128 and the first electrode 124 are disposed on the first substrate 110 which is formed of a bendable transparent material having flexibility such as plastic or a rigid transparent material such as glass. The above-described conductive pattern 128 is formed of a transparent metal oxide such as indium tin oxide (ITO) and indium zinc oxide (IZO). Further, the first electrode 124 uses a transparent conductive material having a high electrical resistance and the reason therefor will be described in detail below.

The first electrode 124 is disposed over an area excluding an outer edge area of the first substrate 110, but at least one conductive pattern 128 is disposed to have a predetermined size. The conductive patterns 128 and the first electrode 124 are in direct contact with each other to be electrically connected. Although in the drawing, the conductive pattern 128 is disposed below the first electrode 124 to be electrically connected, the conductive pattern 128 may be disposed above the first electrode 124 to be connected to the first electrode.

Even though not illustrated in the drawing, the first pad and the second pad may be disposed at the edge area of the first substrate 110. In this case, the first pad and the second pad may be formed of the same material as the first electrode 124 by the same process.

The auxiliary electrode 122 is disposed on the first substrate 110 to be electrically connected to the first electrode 124. The first electrode 124 is formed of a transparent conductive material to have an advantage in that the emitted light may pass through the first electrode, but also have a disadvantage in that an electric electrical resistance is very high as compared with metal. Therefore, when a large size lighting apparatus 100 is manufactured, the distribution of the current applied to a large lighting area may not be uniform due to a high electrical resistance of the transparent conductive material and the large size lighting apparatus 100 may not emit light with uniform luminance due to the non-uniform current distribution.

The auxiliary electrode 122 is disposed over the entire first substrate 110 to have a matrix type with a small thickness, a mesh type, a hexagonal shape, an octagonal shape, or a circular shape to allow a uniform voltage to be applied to the first electrode 124 of the entire first substrate 110. Therefore, the light with a uniform luminance can be emitted from the large size lighting apparatus 100.

Although the auxiliary electrode 122 is disposed below the first electrode 124 in the drawing, the auxiliary electrode 122 may be disposed above the first electrode 124. The auxiliary electrode 122 is made of a metal having a good conductivity, such as Al, Au, Cu, Ti, W and Mo, or an alloy thereof. Although in the drawing, the auxiliary electrode 122 has a single layer structure, the auxiliary electrode 122 may be formed of a plurality of layers including two or more layers.

Further, the auxiliary electrode 122 is disposed in a matrix form to divide the first substrate 110 into a plurality of pixel units. That is, the auxiliary electrode 122 has a very low electrical resistance as compared with the first electrode 124 so that the voltage of the first electrode 124 is not directly applied to the first electrode 124 through the first pad, but is applied through the auxiliary electrode 122. Therefore, even though the first electrode 124 is formed over the entire first substrate 110, the first electrode 124 is divided into a plurality of pixels by the auxiliary electrode 122.

In the present disclosure, the auxiliary electrode 122 is formed to have a width of approximately 40 to 60 μm, but the auxiliary electrode 122 may be determined by various factors such as a type of metal to be used, an area of the lighting apparatus 100, or a size of the pixel.

As illustrated in FIGS. 1 and 2, the at least one conductive pattern 128 is disposed in each pixel to be spaced apart from each other. Specifically, the at least one conductive pattern 128 is disposed in the emission region of each pixel. Although in the drawing, the conductive pattern 128 may have a square shape, the shape of the conductive pattern 128 is not limited to a specific shape such as a square shape, but may be formed of various shapes such as polygons including a circle, an oval, a triangle, and a pentagon. Further, although in the drawing, a predetermined number of conductive patterns 128 is regularly disposed in a matrix form, the conductive patterns 128 are not disposed to have a specific number or a specific shape, but may be disposed to have various numbers and various shapes. The at least one conductive pattern 128 may be formed of the same material as the auxiliary electrode 122.

A protective layer 112 is laminated above the first electrode 124 of the first substrate 110. The protective layer 112 may cover the auxiliary electrode 122 and the first electrode 124 above the auxiliary electrode 122. Since the auxiliary electrode 122 is made of opaque metal, the light is not output to an area where the auxiliary electrode 122 is formed. Therefore, the protective layer 112 is provided only above the auxiliary electrode 122 and is not disposed in an actual emission area (that is, a pixel) so that the light is emitted only from the emission area of the pixel to be output.

Further, the protective layer 112 is formed to enclose the auxiliary electrode 122 to reduce a step difference caused by the auxiliary electrode 122. Therefore, various layers formed thereafter are stably formed without being disconnected.

Further, the cross-section of the auxiliary electrode 122 may have a shape of taper, and the cross-section of the protective layer 112 may have the same taper shape.

The protective layer 112 is made of an inorganic layer such as SiOx and SiNx. However, the protective layer 112 may include an organic layer such as photoacryl or also may include a plurality of layers of inorganic layers and organic layers.

The organic light emitting layer 130 and the second electrode 126 are disposed above the first electrode 124 and the protective layer 112.

The organic light emitting layer 130 is a white light emitting layer and may include a red light emitting layer, a blue light emitting layer, and a green light emitting layer or may include a tandem structure including a blue light emitting layer and a yellow-green light emitting layer. Further, the organic light emitting layer 130 may further include an electron injection layer and a hole injection layer which inject electrons and holes to the organic light emitting layer, respectively and an electron transport layer and a hole transport layer which transport the injected electrons and holes to the organic light emitting layer, respectively, and a charge generating layer which generates charges such as electrons and holes.

A material which receives holes and electrons from the hole transport layer and the electron transport layer to couple the holes and electrons to emit light in a visible light region and has a good quantum efficiency for fluorescence or phosphorescence is desirable for the organic light emitting layer 130. Examples of such an organic material may include 8-hydroxy-quinoline aluminum complex (Alq3), a carbazole based compound, a dimerized styryl compound, BAlq, a 10-hydroxybenzoquinoline-metal compound, benzoxazole, benzothiazole, and benzimidazole-based compounds, and poly (p-phenylenevinylene) (PPV), but are not limited thereto.

Further, the second electrode 126 may include a metal such as Ca, Ba, Mg, Al and Ag, or an alloy thereof. Even though not illustrated in the drawing, a second pad which is connected to the second electrode 126 to apply a voltage to the second electrode 126 is provided above an outer edge of the first substrate 110.

The first electrode 124, the organic light emitting layer 130, and the second electrode 126 constitute the organic light emitting diode. In this case, the first electrode 124 serves as an anode of the organic light emitting diode and the second electrode 126 serves as a cathode of the organic light emitting diode. When the voltage is applied to the first electrode 124 and the second electrode 126, the electrons from the second electrode 126 are injected into the organic light emitting layer 130 and the holes from the first electrode 124 are injected into the organic light emitting layer 130. Thereafter, excitons are generated in the organic light emitting layer 130. As the excitons are decayed, light corresponding an energy difference of a lowest unoccupied molecular orbital (LUMO) and a highest occupied molecular orbital (HOMO) of the light emitting layer is generated to be radiated in a lower direction (toward the substrate 110 in the drawing).

The protective layer 112 is disposed above the auxiliary electrode 122 so that the organic light emitting layer 130 above the auxiliary electrode 122 is not in direct contact with the first electrode 124. Therefore, the organic light emitting diode is not formed above the auxiliary electrode 122. In other words, the organic light emitting diode in the lighting apparatus 100 is formed only in a pixel between auxiliary electrodes 122 formed in a matrix form.

An adhesive agent 118 is applied on the first substrate 110 equipped with the organic light emitting diode and a second substrate 170 is disposed thereon so that the second substrate 170 is attached by the adhesive agent 118. By doing this, the lighting apparatus 100 is sealed. The adhesive agent 118 may use a photo-curing adhesive or a thermosetting adhesive. The second substrate 170 may include various materials. As illustrated in the drawing, the adhesive agent 118 is also provided on the side of the organic light emitting diode to completely seal the organic light emitting diode.

The second substrate 170 is provided to suppress moisture or air from permeating from the outside, so that any material which performs the above-mentioned function may be used. For example, the second substrate 170 may include a polymer such as polyethyleneterephtalate (PET) or a thin metal foil such as aluminum.

Further, even though not illustrated in the drawing, a protective layer may include an organic layer and/or inorganic layer and an encapsulating agent including an epoxy compound, an acrylate compound, or an acrylic compound may be provided on the second electrode 126 and on the side of the organic light emitting diode.

In the meantime, in the present disclosure, the first electrode 124 is made of a transparent conductive material having a high electrical resistance so that it is possible to suppress the failure caused by the short-circuit caused when the first electrode 124 and the second electrode 126 are in electrical contact with each other, which will be described in more detail below.

Figure 3A:
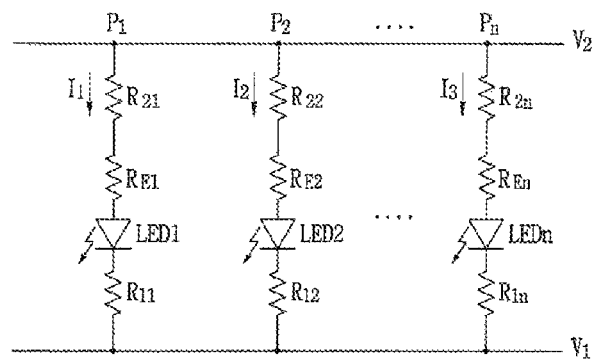
FIGS. 3A and 3B are views schematically illustrating a circuit of an organic light emitting diode provided in the lighting apparatus.

FIG. 3A is a view schematically illustrating a circuit of an organic light emitting diode provided in a lighting apparatus. As illustrated in FIG. 3A, voltages V1 and V2 are applied to the first electrode 124 and the second electrode 126, respectively and resistors $R_{E1}$, $R_{E2}$, . . . , $R_{En}$ of the organic light emitting layer 130, resistors $R_{11}$, $R_{12}$, . . . , $R_{1n}$ of the first electrode 124, and resistors $R_{21}$, $R_{22}$, . . . , $R_{2n}$ of the second electrode 126 are connected in series between the first electrode 124 and the second electrode 126.

An organic light emitting diode provided in the lighting apparatus includes a plurality of pixels $P_1$, $P_2$, . . . , $P_n$ and the pixels are connected in parallel with other pixels.

In the organic light emitting diode with the above-described structure, the plurality of pixels is connected in parallel to apply voltages V1 and V2 to the first electrode 124 and the second electrode 126, respectively. Therefore, currents $I_1, I_2, \ldots, I_n$ are applied to organic light emitting layers LED1, LED2, ..., LEDn of the pixels $P_1, P_2, \ldots, P_n$ so that the organic light emitting layers LED1, LED2, ..., LEDn emit light. In this case, a voltage V1 having a predetermined magnitude may be applied to the first electrode 124 and the second electrode 126 may be grounded.

Approximately the same electrical resistance is formed in the plurality of pixels (even though the electrical resistance may vary depending on a thickness error of the electrodes 124 and 126 and the organic light emitting layer 130 formed in each pixel $P_1, P_2, \ldots, P_n$, the difference is insignificant). Therefore, light with approximately the same luminance is emitted from the plurality of pixels so that uniform light is output from the entire lighting apparatus.

In the meantime, the organic light emitting layer 130 of the organic light emitting diode is formed to have a thin thickness of several hundred Å. Therefore, when foreign materials penetrate into the organic light emitting layer 130 due to a process failure, pinholes or cracks are generated in the organic light emitting layer 130. Therefore, the first electrode 124 and the second electrode 126 are in contact with each other through the organic light emitting layer 130, which may cause a short circuit. Further, in the case of the lighting apparatus, various metal layers and insulating layers are formed below the organic light emitting layer 130. In this case, the organic light emitting layer 130 is cracked due to a step of the metal layer and the insulating layer so that the first electrode 124 and the second electrode 126 may be in contact with each other. Further, since the organic light emitting material is not uniformly applied due to a process failure or a process error during the laminating process of the organic light emitting layer 130, the first electrode 124 and the second electrode 126 may be electrically connected to each other.

Figure 3B:
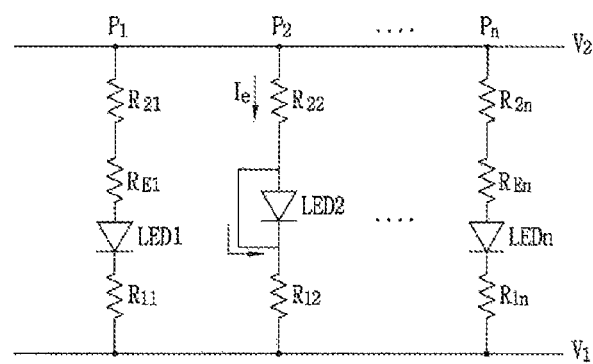

FIG. 3B is a view illustrating a circuit of an organic light emitting diode when an electric short is caused in the first electrode 124 and the second electrode 126.

As illustrated in FIG. 3B, in one pixel $P_2$ among the plurality of pixels $P_1, P_2, \ldots, P_n$ of the organic light emitting diode, when the first electrode 124 and the second electrode 126 are in contact with each other or electrically connected to each other, the electrical resistance $R_{E2}$ by the organic light emitting layer 130 is removed from the pixel so that only the electrical resistances $R_{12}$ and R22 by the conductive material of the first electrode 124 and the second electrode 126 remain.

When the first electrode 124 is formed of a transparent metallic oxide material having a relatively good conductivity, such as indium tin oxide (ITO) and indium zinc oxide (IZO), electrical resistances $R_{11}, R_{12}, \ldots, R_{1n}$ of the first electrode 124 are approximately 20Ω. Further, the electrical resistances $R_{21}, R_{22}, \ldots, R_{2n}$ of the second electrode 126 formed of metal are approximately 0.1Ω. In contrast, the electrical resistances $R_{E1}, R_{E2}, \ldots, R_{En}$ of the organic light emitting layer 130 are approximately 1 mΩ. Therefore, the electrical resistances $R_{E1}, R_{E2}, \ldots, R_{En}$ of the organic light emitting layer 130 are much higher than the electrical resistances $R_{11}, R_{12}, \ldots, R_{1n}$ of the first electrode 124 and the electrical resistances $R_{21}, R_{22}, \ldots, R_{2n}$ of the second electrode 126. Therefore, total electrical resistances Rt1, Rt2, ..., Rtn of the pixels $P_1, P_2, \ldots, P_n$ are substantially equal to the electrical resistances $R_{E1}, R_{E2}, \ldots, R_{En}$ of the organic light emitting layer 130 (Rt≈$R_E$).

Therefore, when the first electrode 124 and the second electrode 126 of the second pixel $P_2$ are in contact with each other so that the second pixel $P_2$ is short-circuited, the electrical resistance $R_{E2}$ of the organic light emitting diode of the pixel $P_2$ is removed to be zero. Therefore, a total electrical resistance Rt2 of the second pixel $P_2$ is much lower than the total electrical resistances Rt1, ..., Rtn of other pixels $P_1, \ldots, P_n$ (Rt2<<Rt1, ..., Rtn).

As a result, the current Ie between the first electrode 124 and the second electrode 126 mostly flows through the short-circuited pixel $P_2$ and hardly flows through other pixels $P_1, \ldots, P_n$. Therefore, the luminance of the organic light emitting layer of the pixels $P_1, \ldots, P_n$ is rapidly degraded or the organic light emitting layer does not emit light. The auxiliary electrode 122 having a good conductivity is provided in the lighting apparatus and the signal is substantially applied to the first electrode 124 of each of the pixels $P_1, P_2, \ldots, P_n$ through the auxiliary electrode 122. Therefore, even though the specific pixel $P_2$ is short-circuited, the reduction of the current in other pixels $P_1, \ldots, P_n$ may be minimized by the auxiliary electrode 122. However, in this case, other pixels $P_1, \ldots, P_n$ are affected by the short-circuited pixel $P_2$ so that the luminance of the entire lighting apparatus is degraded.

Furthermore, overcurrent Ie flows in the short-circuited pixel P2 so that a temperature of the short-circuited area is increased to degrade the organic light emitting layer 130 of the organic light emitting diode.

In order to suppress such a failure, in the present disclosure, the first electrode 124 is formed of a transparent conductive material having a relatively high electrical resistance so that a separate short reduction resistor is provided in each of the pixels $P_1, P_2, \ldots, P_n$ of the organic light emitting diode.

Figure 4A:
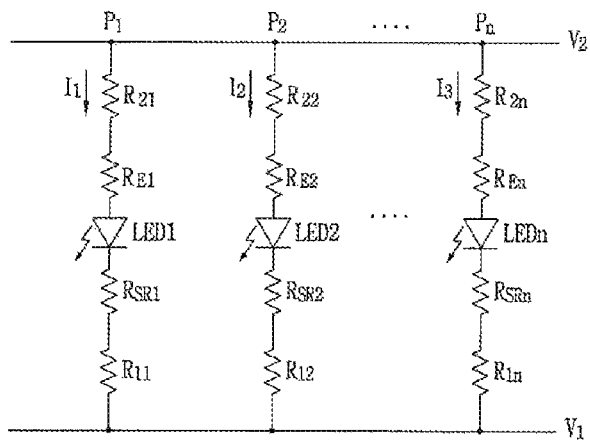
FIGS. 4A and 4B are circuit diagrams of an organic light emitting diode including a separate short reduction resistor.
Figure 4B:
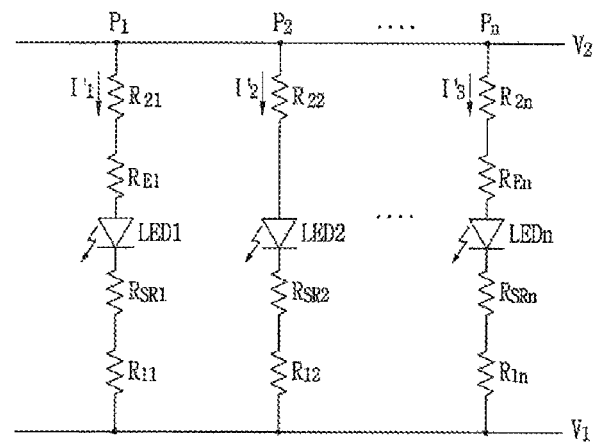

FIGS. 4A and 4B are circuit diagrams of an organic light emitting diode including a separate short reduction resistor.

As illustrated in FIG. 4A, not only the resistors $R_{E1}, R_{E2}, \ldots, R_{En}$ of the organic light emitting layer 130, the resistors $R_{11}, R_{12}, \ldots, R_{1n}$ of the first electrode 124 and the resistors $R_{21}, R_{22}, \ldots, R_{2n}$ of the second electrode 126, but also short reduction resistors $R_{SR1}, R_{SR2}, \ldots, R_{SRn}$ are connected in series, in the plurality of pixels $P_1, P_2, \ldots, P_n$ which are connected in parallel.

In the organic light emitting diode having the structure as described above, voltages V1 and V2 are applied to the first electrode 124 and the second electrode 126, respectively. Therefore, currents are applied to organic light emitting layers LED1, LED2, ..., LEDn of the pixels $P_1, P_2, \ldots, P_n$ to cause the organic light emitting layers LED1, LED2, ..., LEDn to emit light.

Since approximately the same electrical resistance is formed in the plurality of pixels $P_1, P_2, \ldots, P_n$, light with approximate luminance is emitted from the plurality of pixels so that uniform light may be output from the entire lighting apparatus.

As illustrated in FIG. 4B, when the first electrode 124 and the second electrode 126 of one pixel $P_2$ among the plurality of pixels $P_1, P_2, \ldots, P_n$ of the organic light emitting diode are in contact with each other, the electrical resistance $R_{E2}$ by the organic light emitting layer 130 is removed so that only the electrical resistances $R_{12}$ and $R_{22}$ by the conductive material of the first electrode 124 and the second electrode 126 and the short reduction electrical resistance $R_{SR2}$ remain.

When the first electrode 124 is formed of a transparent metallic oxide material having a relatively good conductivity, such as indium tin oxide (ITO) and indium zinc oxide (IZO), electrical resistances $R_{11}, R_{12}, \ldots, R_{1n}$ of the first electrode 124 are approximately 20Ω. Further, the electrical resistances $R_{21}, R_{22}, \ldots, R_{2n}$ of the second electrode 126 formed of metal are approximately 0.1Ω. In contrast, the electrical resistances $R_{E1}, R_{E2}, \ldots, R_{En}$ of the organic light emitting layer 130 are approximately 1 MΩ. Therefore, when the short reduction resistors $R_{SR1}, R_{SR2}, \ldots, R_{SRn}$ are not provided, the electrical resistances $R_{E1}, R_{E2}, \ldots, R_{En}$ of the organic light emitting layer 130 are much higher than the electrical resistances $R_{11}, R_{12}, \ldots, R_{1n}$ of the first electrode 124 and the electrical resistances $R_{21}, R_{22}, \ldots, R_{2n}$ of the second electrode 126. Therefore, the total electrical resistances Rt1, Rt2, . . . , Rtn of each of the pixels $P_1, P_2, \ldots, P_n$ are substantially equal to the electrical resistances $R_{E1}, R_{E2}, \ldots, R_{En}$ of the organic light emitting layer 130 (Rt≈$R_E$).

However, as illustrated in the drawing, when separate short reduction resistors $R_{SR1}, R_{SR2}, \ldots, R_{SRn}$ are provided in each pixel, total electrical resistances Rt1, Rt2, . . . , Rtn of the pixels $P_1, P_2, \ldots, P_n$ are not substantially equal to the electrical resistances $R_{E1}, R_{E2}, \ldots, R_{En}$ of the organic light emitting layer 130.

Similar to the electrical resistances $R_{11}, R_{12}, \ldots, R_{1n}$ of the first electrode 124 and the electrical resistances $R_{21}, R_{22}, \ldots, R_{2n}$ of the second electrode 126, when the short reduction electrical resistances $R_{SR1}, R_{SR2}, \ldots, R_{SRn}$ are formed to be several tens n or lower so that the short reduction electrical resistances $R_{SR1}, R_{SR2}, \ldots, R_{SRn}$ are much lower than the electrical resistances $R_{E1}, R_{E2}, \ldots, R_{En}$ of the organic light emitting layer 130, total electrical resistances Rt1, Rt2, . . . , Rtn of the pixels $P_1, P_2, \ldots, P_n$ are substantially equal to the electrical resistances $R_{E1}, R_{E2}, \ldots, R_{En}$ of the organic light emitting layer 130.

However, when the short reduction electrical resistances $R_{SR1}, R_{SR2}, \ldots, R_{SRn}$ are significantly high as compared with the electrical resistances $R_{E1}, R_{E2}, \ldots, R_{En}$ of the organic light emitting layer 130, the total electrical resistances Rt1, Rt2, . . . , Rtn of the pixels $P_1, P_2, \ldots, P_n$ are substantially equal to a sum of the electrical resistances $R_{E1}, R_{E2}, \ldots, R_{En}$ of the organic light emitting layer 130 and the short reduction electrical resistances $R_{SR1}, R_{SR2}, \ldots, R_{SRn}$ (Rt1, Rt2, . . . , Rtn≈$R_{E1}, R_{E2}, \ldots, R_{En}+R_{SR1}, R_{SR2}, \ldots, R_{SRn}$).

As described above, when the short reduction resistors $R_{SR1}, R_{SR2}, \ldots, R_{SRn}$ having a predetermined magnitude are provided in the pixels $P_1, P_2, \ldots, P_n$, if the first electrode 124 and the second electrode 126 of the second pixel $P_2$ are in contact with each other, the electrical resistance $R_{E2}$ of the organic light emitting diode of the pixel $P_2$ is removed to be zero. Therefore, a total electrical resistance Rt2 of the second pixel $P_2$ is substantially equal to the short reduction electrical resistance $R_{SR2}$ (Rt2≈$R_{SR2}$).

However, the short reduction electrical resistance $R_{SR2}$ is not so very lower than the electrical resistance $R_{E2}$ of the organic light emitting layer 130, but has a significant magnitude. Therefore, the current between the first electrode 124 and the second electrode 126 does not mostly flow through the short-circuited pixel $P_2$, but a predetermined amount of current I'$_2$ flows through the pixel $P_2$. In this case, even though an amount of current flowing through the second pixel $P_2$ and an amount of current flowing through other pixels $P_1, \ldots, P_n$ are different due to the difference in a total electrical resistance of the second pixel $P_2$ and other pixels $P_1, \ldots, P_n$ (I'$_2$≠I'$_1, \ldots,$ I'$_n$), the current flows through the entire pixels $P_1, P_2, \ldots, P_n$. Therefore, a phenomenon in that the luminance of the organic light emitting layer of the plurality of pixels $P_1, P_2, \ldots, P_n$ is rapidly degraded or the organic light emitting layer does not emit light may be suppressed.

In the present disclosure, magnitudes of the short reduction electrical resistances $R_{SR1}, R_{SR2}, \ldots, R_{SRn}$ are appropriately set so that even though the first electrode 124 and the second electrode 126 of one pixel among the plurality of pixels $P_1, P_2, \ldots, P_n$ are in contact with each other, overcurrent does not flow through the short-circuited pixel but a set current flows. Therefore, the lowering of the luminance of the organic light emitting diode can be suppressed.

According to the present disclosure, the first electrode 124 may be made of a transparent conductive material with electrical resistance of at least half of that of the organic light emitting layer 130. For example, the electrical resistance of the first electrode 124 may be 2800 to 5500Ω. When the magnitudes of the short reduction electrical resistances $R_{SR1}, R_{SR2}, \ldots, R_{SRn}$ of the organic light emitting diode which is formed of the plurality of pixels $P_1, P_2, \ldots, P_n$ are approximately 2800 to 5500Ω, even when the first electrode 124 and the second electrode 126 of a specific pixel are in contact with each other, overcurrent does not flow through the short-circuited pixel but a set current flows. Therefore, all the pixels $P_1, P_2, \ldots, P_n$ of the organic light emitting diode may emit light.

Figure 5A:
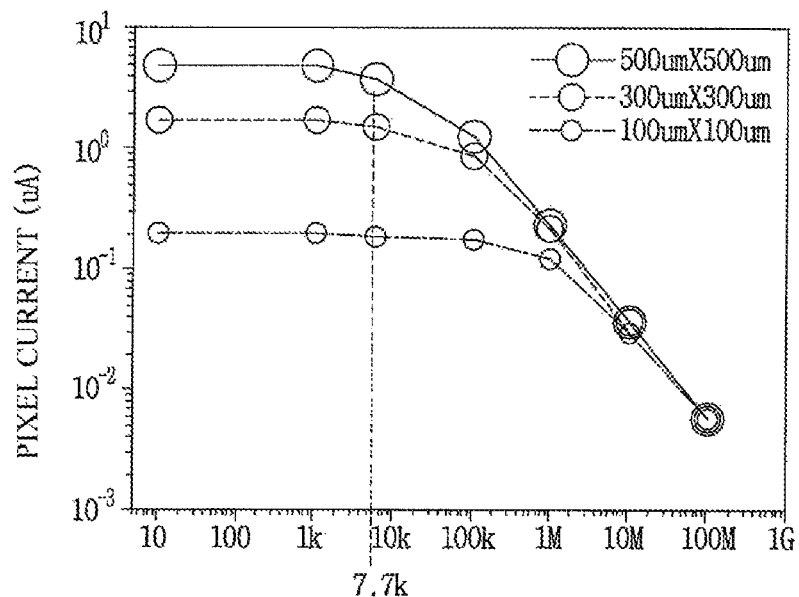
FIG. 5A is a graph illustrating a relationship between a pixel current and a short reduction electrical resistance which are applied to a pixel when no short-circuit is caused in the pixel of an organic light emitting diode.
Figure 5B:
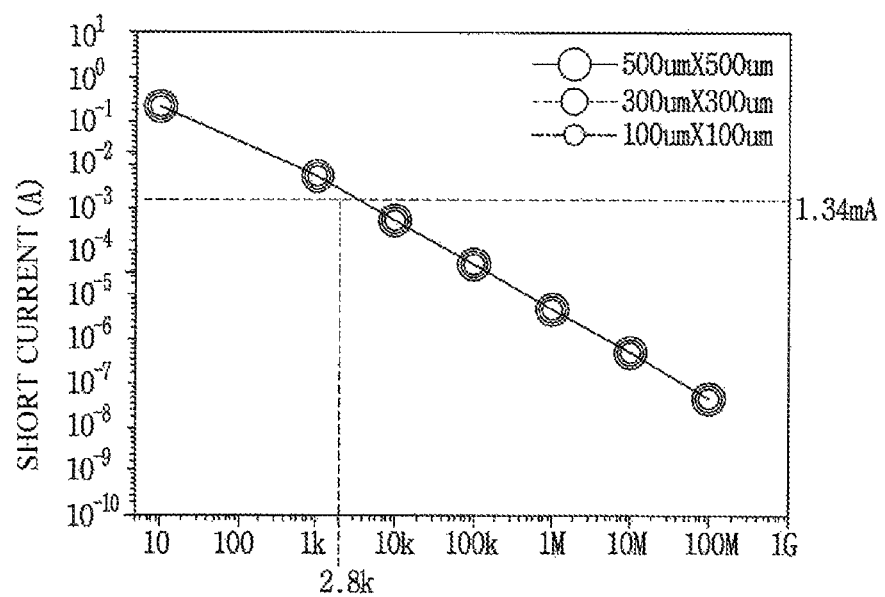
FIG. 5B is a graph illustrating a relationship between a short current and a short reduction electrical resistance which are applied to a short-circuited pixel when a short-circuit is caused in the pixel of an organic light emitting diode.

FIG. 5A is a graph illustrating a relationship between a pixel current and a short reduction electrical resistance which are applied to the pixels $P_1, P_2, \ldots, P_n$ when no short-circuit is generated in the pixels $P_1, P_2, \ldots, P_n$ of an organic light emitting diode and FIG. 5B is a graph illustrating a relationship between a short current and a short reduction electrical resistance which are applied to the short-circuited pixels $P_1, P_2, \ldots, P_n$ when a short-circuit is generated in the pixels $P_1, P_2, \ldots, P_n$ of an organic light emitting diode. In the graphs of FIGS. 5A and 5B, a relationship of the short reduction electrical resistance and the current when the sizes of the pixels $P_1, P_2, \ldots, P_n$ are 500×500 μm$^2$, 300×300 μm$^2$, 100×100 μm$^2$, respectively is illustrated.

As illustrated in FIG. 5A, when no short-circuit is generated in the pixels $P_1, P_2, \ldots, P_n$ of the organic light emitting diode, the organic light emitting diode is normally driven to emit light from the entire organic light emitting diode. In this case, the current required to normally drive the organic light emitting diode may vary depending on the size of the pixels $P_1, P_2, \ldots, P_n$. For example, in the case when a current of approximately 3.0 to 5.0 μA is applied to an organic light emitting diode in which a size of the pixels $P_1, P_2, \ldots, P_n$ is 500×500 μm$^2$, the organic light emitting diode is normally driven to emit light. In the case when a current of approximately 1.5 to 1.8 μA is applied to an organic light emitting diode in which a size of the pixels $P_1, P_2, \ldots, P_n$ is 300×300 μm$^2$, the organic light emitting diode is normally driven to emit light. Further, when a current of approximately 0.19 to 0.20 μA is applied to an organic light emitting diode in which a size of the pixels $P_1, P_2, \ldots, P_n$ is 100×100 μm$^2$, the organic light emitting diode is normally driven to emit light.

As illustrated in FIG. 5A, when a magnitude of the short reduction electrical resistances $R_{SR1}, R_{SR2}, \ldots, R_{SRn}$ of the pixels $P_1, P_2, \ldots, P_n$ of the organic light emitting diode is increased, the pixel current applied to the pixels $P_1, P_2, \ldots, P_n$ of the organic light emitting diode is rapidly lowered. For example, when the short reduction electrical resistances $R_{SR1}, R_{SR2}, \ldots, R_{SRn}$ are increased to be 5500Ω or higher, currents which are applied to the pixels $P_1, P_2, \ldots, P_n$ of the organic light emitting diode having different sizes are lowered to 3.0 μA or lower, 1.5 μA or lower, and 0.19 μA or lower so that the luminance of the organic light emitting diode is significantly degraded. Therefore, when the magnitudes of the short reduction electrical resistances $R_{SR1}$, $R_{SR2}$, . . . , $R_{SRn}$ of the pixels $P_1$, $P_2$, . . . , $P_n$ of the organic light emitting diode are 5500 n or higher, the failure due to the degradation of the luminance is generated.

As illustrated in FIG. 5B, when the short-circuit is generated in the pixels $P_1$, $P_2$, . . . , $P_n$ of the organic light emitting diode, the short current is applied to the short-circuited pixel so that the organic light emitting diode is not normally driven.

According to the present disclosure, when the short current flowing in the short-circuited pixel of the organic light emitting diode exceeds approximately 1.34 mA, a current which is applied to the other pixel is rapidly lowered due to the overcurrent of the short-circuited pixel so that the entire luminance of the organic light emitting diode can be degraded.

As illustrated in FIG. 5B, when a magnitude of the short reduction electrical resistances $R_{SR1}$, $R_{SR2}$, . . . , $R_{SRn}$ of the pixels $P_1$, $P_2$, . . . , $P_n$ of the organic light emitting diode is reduced, the short current applied to the short-circuited pixel of the organic light emitting diode is rapidly increased. For example, when the short reduction electrical resistances $R_{SR1}$, $R_{SR2}$, . . . , $R_{SRn}$ are lowered to 2800Ω, the short current applied to the short-circuited pixel of the organic light emitting diode exceeds 1.34 mA. Therefore, the entire luminance of the organic light emitting diode is degraded. Further, when the short reduction electrical resistances $R_{SR1}$, $R_{SR2}$, . . . , $R_{SRn}$ are further lowered to 2800Ω or lower, the short current is further increased so that the organic light emitting diode is unable to be driven. Therefore, when the magnitude of the short reduction electrical resistances $R_{SR1}$, $R_{SR2}$, . . . , $R_{SRn}$ of the short-circuited pixel is 2800Ω or lower, the organic light emitting diode is unable to be driven due to the increased short current.

As described above, in the present disclosure, when the short reduction electrical resistances $R_{SR1}$, $R_{SR2}$, . . . , $R_{SRn}$ of the plurality of pixels $P_1$, $P_2$, . . . , $P_n$ are 5500Ω or higher, the luminance of the organic light emitting diode is significantly degraded. Further, when the short reduction electrical resistances $R_{SR1}$, $R_{SR2}$, . . . , $R_{SRn}$ of the plurality of pixels $P_1$, $P_2$, . . . , $P_n$ are 2800Ω or lower, the entire luminance of the organic light emitting diode is degraded. Therefore, the short reduction electrical resistances $R_{SR1}$, $R_{SR2}$, . . . , $R_{SRn}$ of the plurality of pixels $P_1$, $P_2$, . . . , $P_n$ are desirably set in the range of 2800Ω≤$R_{SR}$≤5500Ω.

In the meantime, the short reduction electrical resistances $R_{SR1}$, $R_{SR2}$, . . . , $R_{SRn}$ may be configured to have various shapes. For example, in the case of the lighting apparatus 100 having the structure illustrated in FIG. 2, a resistive layer having a predetermined electrical resistance, for example, 2800Ω to 5500Ω is provided between the first electrode 124 and the organic light emitting layer 130 and/or between the second electrode 126 and the organic light emitting layer 130 to add short reduction electrical resistances $R_{SR1}$, $R_{SR2}$, . . . , $R_{SRn}$ to each of the pixels $P_1$, $P_2$, . . . , $P_n$ of the organic light emitting diode. However, in this case, there are problems in that a process for forming a separate resistive layer is added to make the manufacturing process complex and increase not only a manufacturing cost but also a thickness of the organic light emitting diode and the lighting apparatus including the same due to the resistive layer.

Further, a resistive pattern having a set electrical resistance is added to each pixel of the lighting apparatus 100 having a structure illustrated in FIG. 1 to add the short reduction electrical resistances $R_{SR1}$, $R_{SR2}$, . . . , $R_{SRn}$ to the pixels $P_1$, $P_2$, . . . , $P_n$.

For example, a separate resistive pattern is added after electrically separating the auxiliary electrode 122 and the first electrode 124 in each pixel of the lighting apparatus 100 having a structure illustrated in FIG. 1 to add the short reduction electrical resistances $R_{SR1}$, $R_{SR2}$, . . . , $R_{SRn}$.

Figure 6:
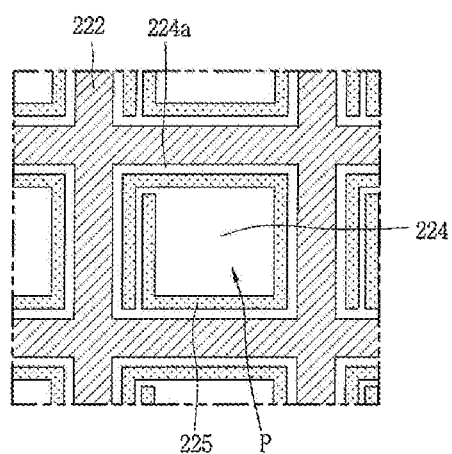
FIG. 6 is a view illustrating an example of a structure of a lighting apparatus including a short reduction resistor by forming a separate pattern in a pixel.

FIG. 6 is a view illustrating an example of a structure of a lighting apparatus including a short reduction resistor by forming a separate pattern in a pixel.

As illustrated in FIG. 6, in a pixel P divided by the auxiliary electrode 222, a first electrode 224 is formed to be spaced apart from the auxiliary electrode 222 with a predetermined distance and the auxiliary electrode 222 and the first electrode 224 are electrically connected to each other by a resistive pattern 224a having a relatively high electrical resistance.

In the lighting apparatus 100 having the structure as described above, the signal which is applied to the auxiliary electrode 222 is applied to the first electrode 224 via the resistive pattern 224a, so that short reduction electrical resistances $R_{SR1}$, $R_{SR2}$, . . . , $R_{SRn}$ having a desired magnitude may be formed by forming the electrical resistance pattern 224a to be sufficiently long (that is, by making a path through which the signal flows sufficiently long).

In this case, in the drawing, the resistive pattern 224a which is formed of the same material as the first electrode 224 is formed by forming the first electrode 224 over the entire lighting apparatus including an upper portion of the auxiliary electrode 222 and forming an open area 225 obtained by removing a part of the first electrode 224. However, after separately forming the first electrode 224 and the auxiliary electrode 222, the resistive pattern 224a may be formed by the same material as or a different material from the first electrode 224 through a different process from the first electrode 224.

However, in the lighting apparatus including the separate resistive pattern 224a as described above, an area where the resistive pattern 224a is formed does not emit light so that an aperture ratio (a ratio of an emission area) of the lighting apparatus is lowered.

Specifically, the resistive pattern 224a needs to be formed to have a set width and a set length to form a set electrical resistance, so that the resistive pattern 224a needs to be formed in the pixel to have a predetermined area regardless of the area of the pixels. Therefore, in the case of a high definition lighting apparatus in which the size of the pixel is small, the aperture ratio is lowered due to the resistive pattern 224a to be a set value or lower, so that the lighting apparatus may be defective. Therefore, when the short reduction electrical resistances $R_{SR1}$, $R_{SR2}$, . . . , $R_{SRn}$ are formed by the resistive pattern 224a, the aperture ratio of the pixel is lowered so that a high definition lighting apparatus cannot be manufactured.

In the present disclosure, the first electrode 124 is formed using a conductive material having a high electrical resistance without providing a separate resistive layer or resistive pattern, to form the short reduction electrical resistances $R_{SR1}$, $R_{SR2}$, . . . , $R_{SRn}$ in each pixel. As R described above, in the present disclosure, a separate resistive layer or resistive pattern is not provided, so that problems in that a process is added, the aperture ratio is lowered, and the high definition lighting apparatus cannot be manufactured can be solved.

The transparent conductive material having a high electrical resistance used for the first electrode 124 of the present disclosure sets the electrical resistance in the pixel to be approximately 2800 to 5500Ω. Therefore, even though the first electrode and the second electrode are in contact with each other, a failure of the lighting apparatus 100 due to the short-circuit of the pixel can be suppressed. In the present disclosure, any transparent conductive material having an electrical resistance in the above-mentioned range may be used, for example, a conductive polymer, a carbon based material, or a nanowire based material may be used. [Jun. 4, 2018]

Figure 7A:
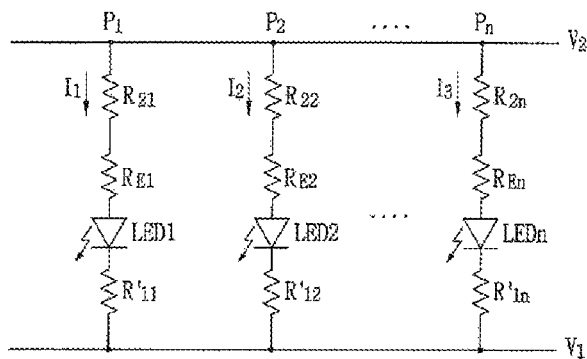
FIGS. 7A and 7B are views illustrating a circuit of an organic light emitting diode according to the present disclosure in which a first electrode is formed of a conductive material having a high electrical resistance.
Figure 7B:
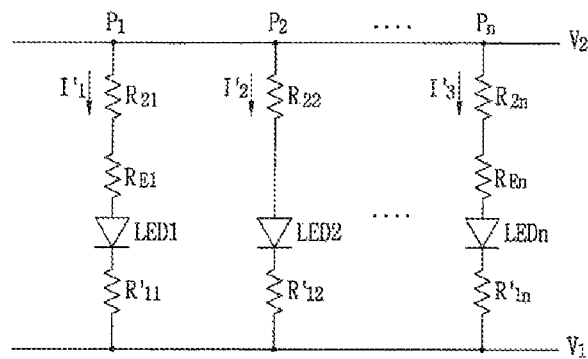

FIGS. 7A and 7B are views illustrating a circuit of an organic light emitting diode according to the present disclosure in which a first electrode 124 is formed of a conductive material having a high electrical resistance.

As illustrated in FIG. 7A, the resistors $R_{E1}, R_{E2}, \ldots, R_{En}$ of the organic light emitting layer 130, the resistors $R'_{11}$(SR1), $R'_{12}$(SR2), ..., $R'_{1n}$(SRn) of the first electrode 124, and the resistors $R_{21}, R_{22}, \ldots, R_{2n}$ of the second electrode 126 are connected in series, in the plurality of pixels $P_1, P_2, \ldots, P_n$ which are connected in parallel. In this case, electrical resistances $R_{21}, R_{22}, \ldots, R_{2n}$ of the second electrode 126 formed of metal such as Ca, Ba, Mg, Al, or Ag or an alloy thereof are approximately 0.1Ω and electrical resistances $R_{E1}, R_{E2}, \ldots, R_{En}$ of the organic light emitting layer 130 are approximately 1 MΩ. Further, the electrical resistances $R'_{11}$(SR1), $R'_{12}$(SR2), ..., $R'_{1n}$(SRn) of the first electrode 124 which is formed of a high electrical resistance conductive material such as a conductive polymer, a carbon based material, or a nanowire based material are approximately 2800 to 5500Ω.

In the organic light emitting diode illustrated in FIG. 4A, that is, in an organic light emitting diode having a structure in which a separate resistive layer or resistive pattern is formed, a separate short reduction electrical resistance is provided. In contrast, in the organic light emitting diode including a conductive material having a high electrical resistance of the present disclosure illustrated in FIG. 7A, a separate short reduction electrical resistance is not formed and the first electrode 124 has a high electrical resistance to serve as a short reduction resistor.

In the organic light emitting diode with the above-described structure, as voltages V1 and V2 are applied to the first electrode 124 and the second electrode 126, respectively, currents $I_1, I_2, \ldots, I_n$ are applied to organic light emitting layers LED1, LED2, ..., LEDn of the pixels so that the organic light emitting layers LED1, LED2, ..., LEDn emit light. In this case, since approximately same electrical resistance is formed in the plurality of pixels $P_1, P_2, \ldots, P_n$, light with approximately same luminance is emitted from the plurality of pixels so that uniform light may be entirely output from the lighting apparatus.

As illustrated in FIG. 7B, when the first electrode 124 and the second electrode 126 of one pixel $P_2$ among the plurality of pixels $P_1, P_2, \ldots, P_n$ of the organic light emitting diode are in contact with each other, the electrical resistance $R_{E2}$ by the organic light emitting layer 130 is removed so that only the electrical resistances $R'_{12}$(SR2) by the conductive material of the first electrode 124 and the electrical resistance $R_{22}$ by the second electrode 126 remain in the pixel of the organic light emitting diode.

The electrical resistances $R'_{11}$(SR1), $R'_{12}$(SR2), ..., $R'_{1n}$(SRn) are approximately 2800 to 5500Ω and the electrical resistances $R_{E1}, R_{E2}, \ldots, R_{En}$ of the organic light emitting layer 130 are approximately 1 MΩ. Therefore, even though the electrical resistance $R_{E2}$ of the organic light emitting layer 130 of the second pixel $P_2$ is removed by the contact of the first electrode 124 and the second electrode 126, the electrical resistance $R'_{12}$(SR2) by the high electrical resistance transparent conductive material of the first electrode 124 remains in the short-circuited second pixel $P_2$.

However, the magnitude of the electrical resistance $R'_{12}$(SR2) is not ignorable as compared with the magnitude of the total electrical resistances of the other pixels $P_1, \ldots, P_n$.

Therefore, when the first electrode 124 and the second electrode 126 of the second pixel P2 are in contact with each other so that the second pixel $P_2$ is short-circuited, the electrical resistance $R_{E2}$ of the organic light emitting diode of the pixel $P_2$ is removed to be zero. Therefore, a total electrical resistance Rt2 of the second pixel $P_2$ is substantially equal to the electrical resistance $R'_{12}$ (SR2) of the first electrode 124 (Rt2≈$R'_{12}$(SR2)).

However, the electrical resistance $R'_{12}$(SR2) of the first electrode 124 is not so very lower than the electrical resistance $R_{E2}$ of the organic light emitting layer 130, but has a significant magnitude. Therefore, the current between the first electrode 124 and the second electrode 126 does not mostly flow through the short-circuited pixel $P_2$, but a predetermined amount of current $I'_2$ flows through the pixel $P_2$. In this case, even though an amount of current flowing through the second pixel $P_2$ and an amount of current flowing through other pixels $P_1, \ldots, P_n$ are different due to the difference in a total electrical resistance of the second pixel $P_2$ and other pixels $P_1, \ldots, P_n$, the current flows through the entire pixels $P_1, P_2, \ldots, P_n$. Therefore, a phenomenon in that the luminance of the organic light emitting layer of the plurality of pixels $P_1, P_2, \ldots, P_n$ is rapidly degraded or the organic light emitting layer does not emit light may be suppressed.

Specifically, in the present disclosure, the short-circuit of the pixels $P_1, P_2, \ldots, P_n$ is suppressed without providing a separate resistive layer, so that the cost increased due to the addition of the process or the lowering of the yield may be suppressed. Moreover, the short-circuit of the pixels $P_1, P_2, \ldots, P_n$ suppressed without providing a separate resistive pattern so that the lowering of the aperture ratio of the lighting apparatus is suppressed. Specifically, it is more effectively used for a high definition lighting apparatus having a pixel area of 300×300 μm².

In the meantime, referring to FIGS. 1 and 2 again, in the present disclosure, a at least one conductive pattern 128 having a set size below (or above) the first electrode 124 formed of a conductive material having a high electrical resistance is disposed in the pixel. The conductive pattern 128 improves a conductivity in each pixel $P_1, P_2, \ldots, P_n$ to improve luminance of the organic light emitting diode.

As described above, in the present disclosure, the first electrode 124 serving as an anode electrode is made of a transparent conductive material having a high electrical resistance, so that even though the first electrode 124 and the second electrode 126 are in contact with each other, the short-circuit of the pixel may be suppressed without providing a short reduction resistor.

However, in the case of the organic light emitting diode having the structure as described above, the electrical resistance is much higher than that of a transparent metal oxide which has been used in the related art, such as ITO or IZO. That is, an electrical resistance of the transparent metal oxide which has been used in the related art, such as ITO or IZO is approximately 20Ω, but the electrical resistance of the high electrical resistance conductive material which is used in the present disclosure is approximately 2800 to 5500Ω. Therefore, the electrical resistance of the high electrical resistance conductive material of the present disclosure is much higher than the electrical resistance of the transparent metal oxide. Therefore, when the first electrode 124 is formed of a high electrical resistance transparent conductive material, the short-circuit of the pixel may be suppressed. However, the luminance of the organic light emitting diode is degraded due to a relatively high electrical resistance.

The conductive pattern 128 suppresses the lowering of the luminance by the first electrode 124 configured by the high electrical resistance conductive material. That is, a at least one conductive pattern 128 is formed in the pixels $P_1, P_2, \ldots, P_n$ to be an island shape while being electrically connected to the first electrode 124 to improve conductivity of the first electrode 124 in the pixels $P_1, P_2, \ldots, P_n$ for every area.

Therefore, the short-circuit of the pixels $P_1, P_2, \ldots, P_n$ of the organic light emitting diode is suppressed by the first electrode 124 which is formed of a high electrical resistance conductive material and the conductive pattern 128 and the lowering of the luminance of the organic light emitting diode is also suppressed.

In the meantime, in the lighting apparatus 100 of the present disclosure, the at least one conductive pattern 128 is provided in each pixel $P_1, P_2, \ldots, P_n$ so that the conductive pattern 128 and the second electrode 126 are in contact with each other. Therefore, the pixel may be short-circuited. However, also in this case, the short-circuit due to the contact of the conductive pattern 128 and the second electrode 126 is restricted to the predetermined area of the pixel, so that defectiveness of the entire pixels may be suppressed.

Figure 8A:
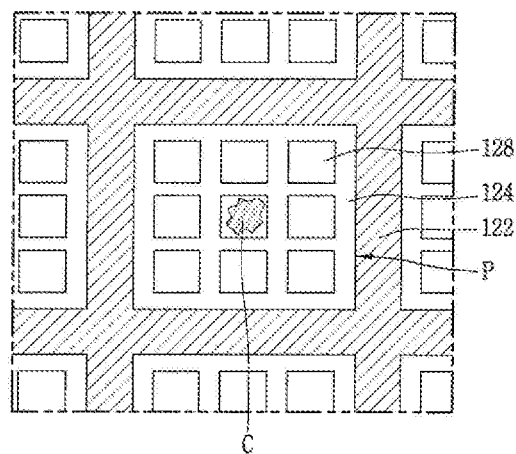
Figure 8B:
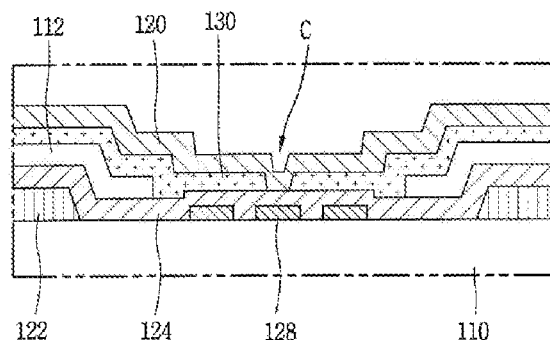

FIGS. 8A and 8B are views illustrating a state in which the first electrode 124 and the second electrode 126 are in electrical contact with each other due to pinholes or cracks in a light emitting diode according to the present disclosure in which FIG. 8A is a plan view and FIG. 8B is a cross-sectional view.

As illustrated in FIGS. 8A and 8B, at least one conducive pattern 128 is disposed in the pixel P which is divided by the auxiliary electrode 122 and the conductive pattern 128 is disposed below (or above) the first electrode 124 to be in entire contact with the first electrode 124.

When a signal is applied to the first electrode 124 via the auxiliary electrode 122, a current is applied between the first electrode 124 and the second electrode 126 to cause the organic light emitting layer 130 to emit light. In this case, the first electrode 124 disposed in the pixel P is formed of a transparent conductive material having a high electrical resistance, but a conductive pattern 128 having a relatively low electrical resistance is formed in the pixel P. Therefore in an area where the first electrode 124 and the conductive pattern 128 are in contact with each other, the electrical resistance of the first electrode 124 is removed by the conductive pattern 128, and only the electrical resistance by the conductive pattern 128 remains.

Therefore, a total electrical resistance Rt of the first electrode 124 in the pixel P is reduced by the conductive pattern 128. Specifically, a reduction ratio of the total electrical resistance Rt corresponds to a ratio of an area a1 of the pixel P and an area a2 of the conductive pattern 128. That is, a total electrical resistance Rt' of the pixel in which the conductive pattern 128 is formed is Rt'=Rt(1−a2/a1) so that a total electrical resistance of the pixel P of the lighting apparatus 100 is reduced by the conductive pattern 128. As a result, the luminance of the lighting apparatus 100 is increased.

When pinholes or cracks are generated in the pixels P due to a process failure such as the penetration of foreign materials during the manufacturing process of a lighting device 100, a contact area C where the first electrode 124 and the second electrode 126 are in electrical contact with each other is generated. Further, since the first electrode 124 is in contact with the conductive pattern 128, the conductive pattern 128 and the second electrode 126 are electrically connected through the contact area C.

Therefore, when a signal is applied to the first electrode 124 through the auxiliary electrode 122, overcurrent flows between the conductive pattern 128 and the second electrode 126. However, since the conductive pattern 128 is formed only in a predetermined area in the pixel P and is separated from the other conductive patterns 128 by the first electrode 124 (that is, the first electrode 124 is disposed between the conductive patterns 128), an area where the overcurrent is formed by the short-circuit is limited to the conductive pattern 128 in which the contact area C is formed and is separated from the other area by the electrical resistance of the first electrode 124 around the conductive pattern 128 in which the contact area C is formed. Therefore, the short-circuit of the conductive pattern 128 in which the contact area C is formed does not affect the other area.

In other words, the failure due to the short-circuit makes only the contact area C in the pixel P defective and the other area does not become defective. Therefore, the other area than the contact area C in the pixel P emits light so that defectiveness of the pixel P may be suppressed.

As described above, in the present disclosure, the first electrode 124 uses a transparent conductive material having a high electrical resistance so that the first electrode serves as the short reduction resistor without providing a separate resistive layer or resistive pattern. Therefore, even though the first electrode and the second electrode are in contact with each other, the failure due to the short-circuit of the organic light emitting diode may be suppressed.

Further, since a separate resistive layer is not provided, the increased cost or the lowering of the yield due to the addition of the process may be suppressed. Moreover, since a separate resistive pattern is not provided, the lowering of the aperture ratio of the lighting apparatus may be suppressed. The aperture ratio of each pixel of the lighting apparatus of the invention may be at least 80%.

For example, in a lighting apparatus having a pixel size of 500×500 $\mu m^2$, in a structure having a resistive pattern, an aperture ratio is approximately 84.1%. However, as described in the present disclosure, when the first electrode is formed of the high electrical resistance transparent conductive material, the aperture ratio is approximately 93.3%. Therefore, the aperture ratio of the lighting apparatus according to the present disclosure is improved by approximately 9% as compared with the lighting apparatus having a structure including a resistive pattern.

Further, in a lighting apparatus having a pixel size of 300×300 $\mu m^2$, in a structure having a resistive pattern, an aperture ratio is approximately 74.1%. However, as described in the present disclosure, when the first electrode is formed of the high electrical resistance transparent conductive material, the aperture ratio is approximately 89%. Therefore, the aperture ratio of the lighting apparatus according to the present disclosure is improved by approximately 15% as compared with the lighting apparatus having a structure including a resistive pattern.

As described above, the aperture ratio of the present disclosure is improved as compared with that of the structure including a resistive pattern and the degree of improvement of the aperture ratio is more obvious in the high definition lighting apparatus having a smaller pixel area.

In a lighting apparatus having a pixel size of 200×200 $\mu m^2$, in a structure having a resistive pattern, an aperture ratio is approximately 62.1%. However, as described in the present disclosure, when the first electrode is formed of the high electrical resistance transparent conductive material, the aperture ratio is approximately 83.7%. Therefore, the present disclosure may be applied to the lighting apparatus having a pixel size of 200×200 µm², but the structure including a resistive pattern may not be used for the lighting apparatus of 200×200 µm² due to the lowering of the aperture ratio.

Moreover, in the present disclosure, at least one conductive pattern 128 having a low electrical resistance and a good conductivity is disposed in each pixel to suppress the degradation of the luminance by the first electrode 124 having a high electrical resistance.

Therefore, the lighting apparatus 100 of the present disclosure may suppress the lowering of luminance and also suppress the failure due to the short-circuit even when the first electrode 124 and the second electrode 126 are in contact with each other due to a process error.

Hereinafter, a manufacturing method of a lighting apparatus 100 according to the present disclosure will be described in detail with reference to the accompanying drawings.

FIGS. 9A to 9D and FIGS. 10A to 10D are views illustrating a manufacturing method of a lighting apparatus 100 in which FIGS. 9A to 9D are plan views and FIGS. 10A to 10D are cross-sectional views.

Figure 9A:
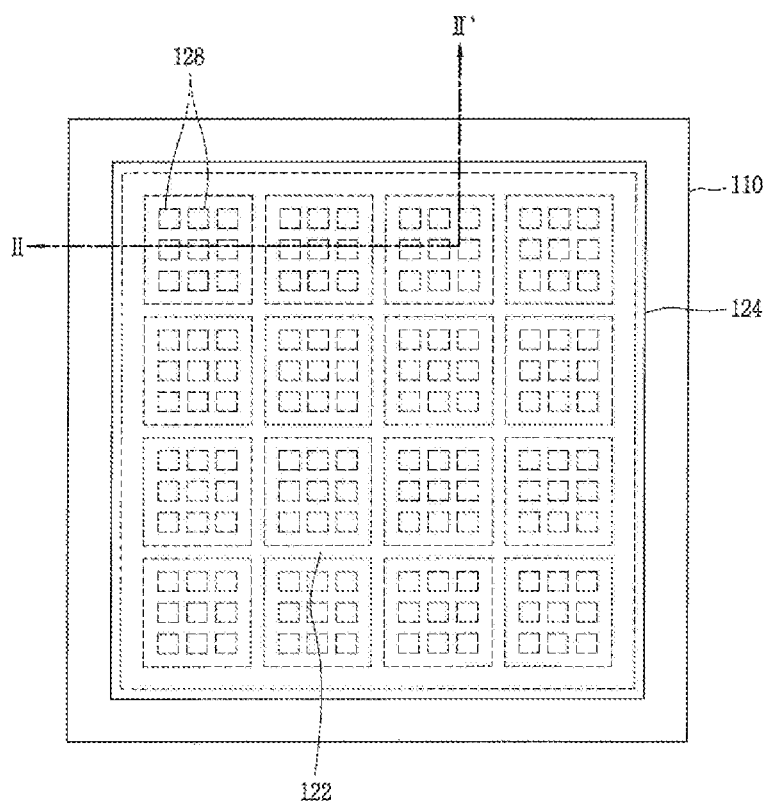
FIGS. 9A to 9D are plan views illustrating a manufacturing method of a lighting apparatus according to the present disclosure.
Figure 10A:
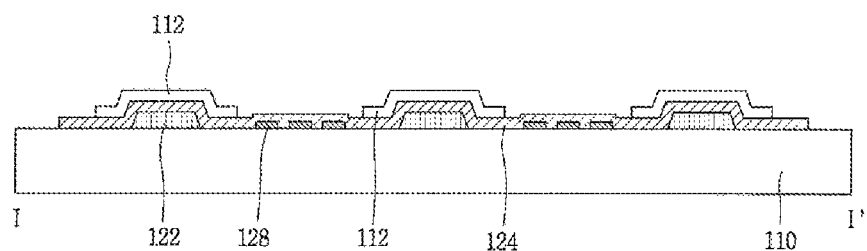
FIGS. 10A to 10D are cross-sectional views illustrating a manufacturing method of a lighting apparatus according to the present disclosure.

First, as illustrated in FIGS. 9A and 10A, after forming an auxiliary electrode 122 formed of a single layer or a plurality of layers by laminating and etching metal such as Al, Au, Cu, Ti, W, Mo, or an alloy thereof on a transparent first substrate 110 formed of a flexible material such as plastic or a rigid material such as glass, at least one conductive pattern 128 is formed on a plurality of pixels divided by the auxiliary electrode 122 by laminating and etching a transparent metal oxide such as ITO or IZO on the first substrate 110.

In this case, the auxiliary electrode 122 is disposed in a matrix in a horizontal direction and a vertical direction to have a strip shape set over the entire first substrate 110, but the auxiliary electrode 122 may be formed to have a mesh type, a hexagonal shape, an octagonal shape, or a circular shape. Further, at least one conductive pattern 128 may be disposed to have various shapes such as a polygon, a triangle, or a circle.

The auxiliary electrode 122 may be formed to have a width of approximately 45 to 55 µm. However, the auxiliary electrode 122 is not limited to have a specific width, but the auxiliary electrode 122 may be formed to have various widths depending on an area of the lighting apparatus, a size of the pixel, and a material of the auxiliary electrode 122.

As described above, the conductive pattern 128 may be formed after forming the auxiliary electrode 122, but the auxiliary electrode 122 may be formed after forming the conductive pattern 128 in the plurality of pixels.

Next, after melting a conductive polymer such as approximately 1 to 10 wt % of poly (3,4-ethylenedioxythophene):polystyrenesulfonic acid (PEDOT:PSS) in a solvent such as approximately 80 to 90 wt % of water or alcohol, a silicone binder such as approximately 10 to 20 wt % of TEOS (Tetraethlyorthosilicate), SSQ (Silsesquioxane), or polysiloxane or an acrylic binder is mixed, and an additive such as a leveling agent and a surface agent within 1 wt % is added to form a transparent conductive material having a high electrical resistance.

Further, after melting a carbon based material such as approximately 1 to 10 wt % of graphene, single wall carbon nano tube (SWCNT), or multi wall nano tube (MWCNT) in a solvent such as approximately 80 to 90 wt % of water or alcohol, a silicone binder such as approximately 10 to 20 wt % of TEOS (Tetraethlyorthosilicate), SSQ (Silsesquioxane), or polysiloxane or an acrylic binder is mixed, and an additive such as a leveling agent and a surface agent within 1 wt % is added to form a transparent conductive material having a high electrical resistance.

Furthermore, after melting a nanowire based material such as approximately 1 to 10 wt % of Cu-nanowire, Ag-nanowire, or Au-nanowire in a solvent such as approximately 80 to 90 wt % of water or alcohol, a silicone binder such as approximately 10 to 20 wt % of TEOS (Tetraethlyorthosilicate), SSQ (Silsesquioxane), or polysiloxane or an acrylic binder is mixed, and an additive such as a leveling agent and a surface agent within 1 wt % is added to form a transparent conductive material having a high electrical resistance.

The high electrical resistance transparent conductive material as described above is laminated and etched over the entire first substrate 110 including the auxiliary electrode 122 and the upper surface of the conductive pattern 128 to form the first electrode 124. In this case, the first electrode 124 may be formed to have a different thickness depending on the type of conductive material. For example, when the conductive polymer is used as a conductive material, the first electrode 124 is formed to have a thickness of approximately 150 to 200 nm and when the carbon based material is used as the conductive material, the first electrode 124 may be formed to have approximately 50 to 100 nm.

In the meantime, after forming the first electrode 124 on the first substrate 110, the auxiliary electrode 122 and the conductive pattern 128 may be formed on the first electrode 124.

As described above, after forming the first electrode 124, the protective layer 112 may be formed on the first electrode 124 above the auxiliary electrode 122 by laminating and etching an inorganic insulating material or an organic insulating material on the first electrode 124. In this case, the protective layer 112 may be configured by a single layer of an inorganic insulating layer or an organic insulating layer or may be configured by a plurality of layers of inorganic insulating layers and organic insulating layers.

Figure 9B:
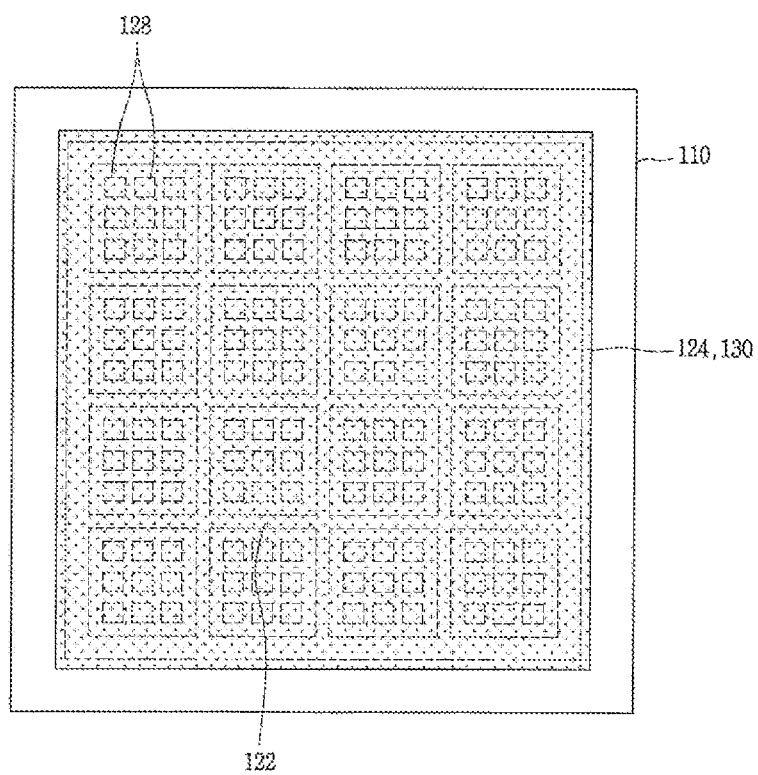
Figure 10B:
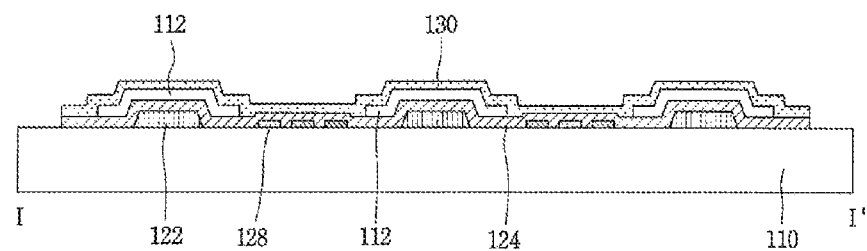

Next, as illustrated in FIGS. 9B and 10B, the organic light emitting layer 130 is formed by depositing an organic light emitting material above the first substrate 110. In this case, the organic light emitting layer 130 may be formed by depositing the organic light emitting material after disposing a mask on a mother substrate on which a plurality of lighting apparatuses is formed.

Figure 9C:
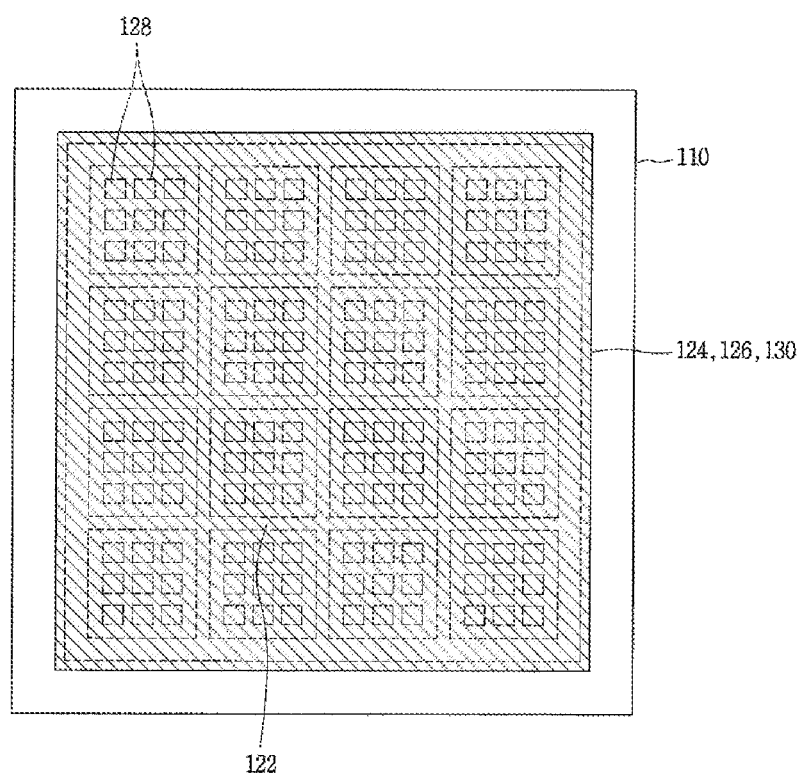
Figure 10C:
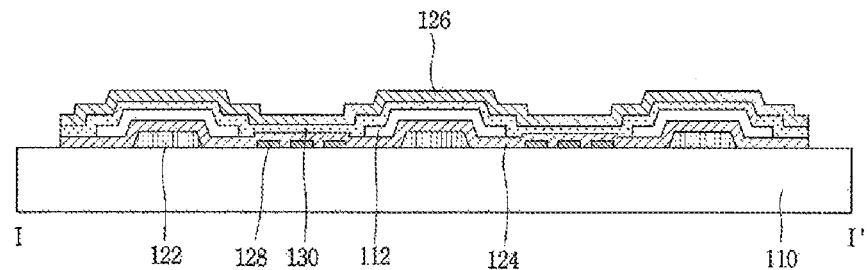

Next, as illustrated in FIGS. 9C and 10C, the second electrode 126 is formed by depositing and etching a metal such as Ca, Ba, Mg, Al, or Ag above the organic light emitting layer 130.

Figure 9D:
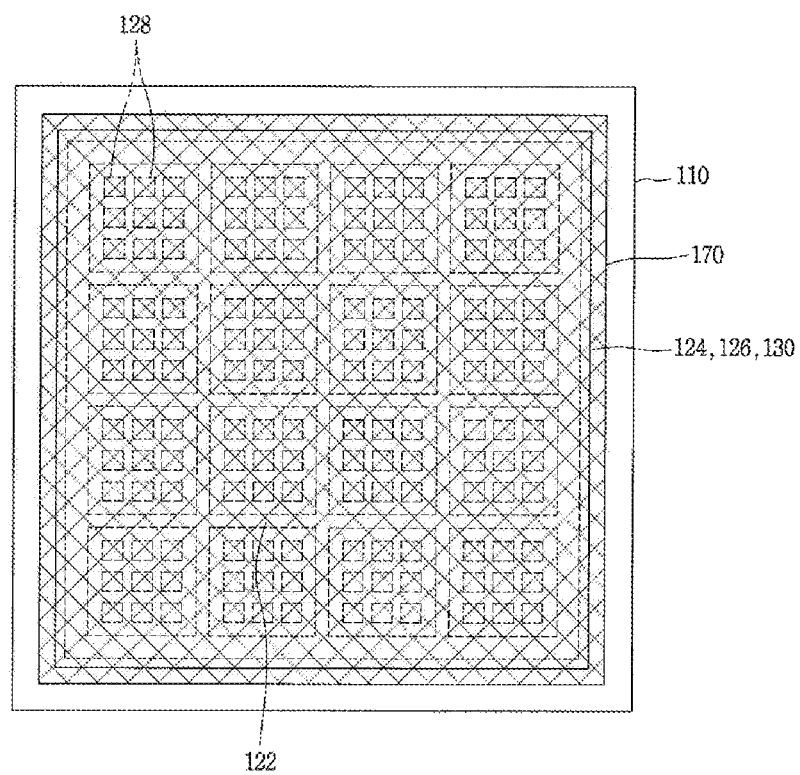
Figure 10D:
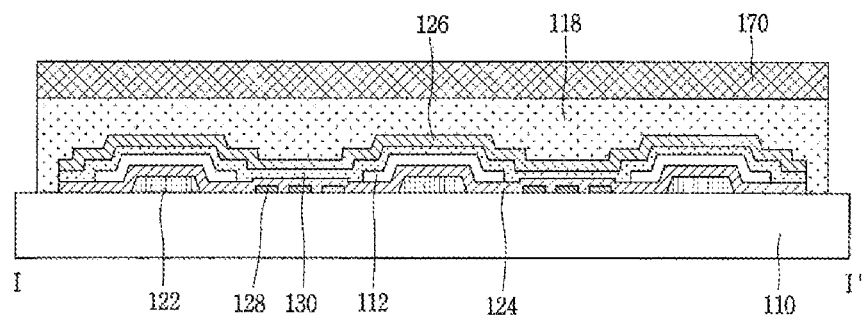

Thereafter, as illustrated in FIGS. 9D and 10D, an adhesive agent 118 formed of a photo-curing adhesive material or a thermosetting adhesive material is applied on the first substrate 110, the second substrate 170 is positioned thereon, and then the adhesive agent 118 is hardened to attach the second substrate 170. Thereafter, the bonded first substrate 110 and second substrate 170 are cut to separate completed lighting apparatuses 100 and complete individual lighting apparatuses 100.

In this case, a polymer film such as PET, a thin metal foil, or glass may be used for the second substrate 170.

The exemplary aspects of the present disclosure can also be described as follows:

According to an aspect of the present disclosure, a lighting apparatus includes: a first substrate including a plurality of pixels; and an organic light emitting diode disposed in each pixel of the first substrate and comprises of a first electrode, an organic light emitting layer, and a second electrode, in which the first electrode is made of a transparent conductive material whose electrical resistance is at least half of that of the organic light emitting layer in each pixel.

According to another aspect, the electrical resistance of the first electrode may 2800 to 5500Ω.

According to another aspect, the first electrode may have a thickness of 50 to 200 nm.

According to another aspect, the lighting apparatus may further include: an auxiliary electrode disposed on the first substrate connected to the first electrode.

According to still another aspect, the auxiliary electrode is arranged in a matrix type, a mesh type, an octagonal shape, a hexagonal shape, or a circular shape.

According to still another aspect, the auxiliary electrode may have a width of 45 to 55 μm.

According to still another aspect, the first electrode may be configured by at least one material selected from a group consisting of a conductive polymer, a carbon based material, and a nanowire based material.

According to still another aspect, the lighting apparatus may further include at least one conductive pattern disposed in each of the plurality of pixels and electrically connected to the first electrode.

According to still another aspect, the at least one conductive pattern may be disposed in an emission region of each pixel.

According to still another aspect, the at least one conductive pattern may be formed of the same material as the auxiliary electrode.

According to still another aspect, the lighting apparatus may further comprise a protective layer disposed on the auxiliary electrode, wherein a cross section of the auxiliary electrode has a shape of taper.

According to still another aspect, a cross section of the protective layer may have the same taper shape as the auxiliary electrode.

According to still another aspect, the at least one conductive pattern may be disposed in each pixel to have an island shape.

According to still another aspect, the at least one conductive pattern may contact the first electrode.

According to still another aspect, each of the at least one conductive pattern may be configured by a polygonal shape, a circular shape, or an oval shape.

According to still another aspect, the at least one conductive pattern may reduce a electrical resistance of the first electrode in the pixel.

According to still another aspect, a electrical resistance of the first electrode in the pixel may be reduced as an area ratio of the at least one conductive pattern with respect to a pixel area is increased so that a luminance of the pixel is increased.

According to still another aspect, the lighting apparatus may further include: a second substrate which is attached to the first substrate by an adhesive agent.

According to still another aspect, an aperture ratio of each pixel may be at least 80%.

According to another aspect of the present disclosure, a light emitting device, comprising: a first substrate; an auxiliary electrode on the first substrate, the auxiliary electrode being disposed in a matrix to divide the first substrate into a plurality of pixels; a first electrode on the first substrate, the first electrode being electrically connected to the auxiliary electrode; an organic light emitting layer on the first electrode; and a second electrode on the organic light emitting layer, wherein the first electrode is made of a transparent conductive material whose electrical resistance is at least half of that of the organic light emitting layer.

According to still another aspect, an electrical resistance of the first electrode may be 2800 to 5500Ω.

According to still another aspect, the light emitting device may further comprise at least one conductive pattern disposed in each of the plurality of pixels and electrically connected to the first electrode.

Various modifications of the present disclosure or a structure which can be easily conceived based on present disclosure should be included within the scope of the present disclosure. Therefore, the scope of the present disclosure is not to be determined by the foregoing detailed description, but should be determined by the appended claims.

What is claimed is:

1. A lighting apparatus, comprising:
a first substrate where a plurality of pixels is formed;
an auxiliary electrode disposed on the first substrate;
at least one conductive pattern disposed at each of the plurality of pixels; and
an organic light emitting diode disposed at each of the plurality of pixels and including a first electrode, an organic light emitting layer and a second electrode;
wherein the first electrode is electrically connected with the auxiliary electrode and the least one conductive pattern, and
wherein the first electrode is formed of a transparent conductive material having an electrical resistance of at least half of the organic light emitting layer.

2. The lighting apparatus according to claim 1, wherein the electrical resistance of the first electrode is in a range of 2800 to 5500Ω.

3. The lighting apparatus according to claim 1, wherein the first electrode has a thickness in a range of 50 to 200 nm.

4. The lighting apparatus according to claim 1, wherein the auxiliary electrode is arranged in a matrix type, a mesh type, an octagonal shape, a hexagonal shape, or a circular shape.

5. The lighting apparatus according to claim 4, wherein the auxiliary electrode has a width in a range of 45 to 55 μm.

6. The lighting apparatus according to claim 1, wherein the first electrode is formed of one of a conductive polymer, a carbon based material, and a nanowire based material.

7. The lighting apparatus according to claim 1, wherein the at least one conductive pattern is disposed at an emission region of each pixel.

8. The lighting apparatus according to claim 1, wherein the at least one conductive pattern is formed of a same material as the auxiliary electrode.

9. The lighting apparatus according to claim 1, further comprising a protective layer disposed on the auxiliary electrode, wherein the auxiliary electrode has a cross-section of a shape of taper.

10. The lighting apparatus according to claim 9, wherein the protective layer has a same cross-section as the auxiliary electrode.

11. The lighting apparatus according to claim 1, wherein the at least one conductive patterns are disposed at each pixel has an island shape.

12. The lighting apparatus according to claim 11, wherein the at least one conductive pattern contacts the first electrode.

13. The lighting apparatus according to claim 11, wherein each of the at least one conductive pattern has a polygonal shape, a circular shape, or an oval shape.

14. The lighting apparatus according to claim 1, wherein the at least one conductive pattern reduces an electrical resistance of the first electrode in the pixel.

15. The lighting apparatus according to claim 14, wherein electrical resistance the first electrode has an electrical resistance reduced as an area ratio of the at least one conductive patterns with respect to a pixel area is increased so that a luminance of each pixel is increased.

16. The lighting apparatus according to claim 1, further comprising a second substrate which is attached to the first substrate.

17. The lighting apparatus according to claim 16, further comprising an adhesive agent attaching the first and second substrates.

18. The lighting apparatus according to claim 1, wherein each pixel has an aperture ratio of at least 80%.

19. A light emitting device, comprising:
a first substrate;
an auxiliary electrode on the first substrate and disposed in a matrix form to divide the first substrate into a plurality of pixels;
at least one conductive pattern disposed at each of the plurality of pixels;
a first electrode on the first substrate and electrically connected with the auxiliary electrode and at least one conductive pattern;
an organic light emitting layer disposed on the first electrode; and
a second electrode disposed on the organic light emitting layer,
wherein the first electrode is formed of a transparent conductive material having an electrical resistance of at least half of the organic light emitting layer.

20. The light emitting device according to claim 19, wherein the first electrode has an electrical resistance in a range of 2800 to 5500 Ω.

21. The lighting apparatus according to claim 19, further comprising a second substrate which is attached to the first substrate.

22. The lighting apparatus according to claim 21, further comprising an adhesive agent attaching the first and second substrates.

23. The lighting apparatus according to claim 19, wherein each pixel has an aperture ratio of at least 80%.

24. The method according to claim 19, further comprising forming a second substrate to attach to the first substrate.

25. The method according to claim 24, further comprising an adhesive agent attaching the first and second substrates.

26. A method of manufacturing a light emitting device, comprising:
forming an auxiliary electrode on a first substrate to be disposed in a matrix form;
forming at least one conductive pattern to be disposed at each of the plurality of pixels;
forming a first electrode on the first substrate to be electrically connected with the auxiliary electrode and at least one conductive pattern;
forming an organic light emitting layer to be disposed on the first electrode; and
forming a second electrode to be disposed on the organic light emitting layer,
wherein the first electrode is formed of a transparent conductive material having an electrical resistance of at least half of the organic light emitting layer.

27. The method according to claim 26, wherein the first electrode has an electrical resistance in a range of 2800 to 5500 Ω.

28. The lighting apparatus according to claim 26, wherein each pixel has an aperture ratio of at least 80%.

* * * * *